United States Patent [19]

Malone et al.

[11] Patent Number: 5,304,794
[45] Date of Patent: Apr. 19, 1994

[54] METHOD FOR MIXING OPTICAL AND MICROWAVE SIGNALS USING A GAAS MESFET

[75] Inventors: Steven A. Malone, Eatontown; Arthur C. Paolella, Howell, both of N.J.

[73] Assignee: The United States of America as represented by the Secretary of the Army, Washington, D.C.

[21] Appl. No.: 66,750

[22] Filed: May 25, 1993

[51] Int. Cl.$^5$ .............................................. H01J 41/14
[52] U.S. Cl. ............................. 250/214 R; 250/214.1
[58] Field of Search ........... 250/214.1, 214 R, 227.11; 331/74; 257/462, 465

[56] References Cited

U.S. PATENT DOCUMENTS 4,546,249 10/1985 Whitehouse et al. .......... 250/227.11
5,157,357 10/1992 Katoh .................................... 331/74

Primary Examiner—David C. Nelms
Assistant Examiner—K. Shami
Attorney, Agent, or Firm—Michael Zelenka; William H. Anderson

[57] ABSTRACT

The present invention utilizes the internal photovoltaic effect of a GaAs MESFET to mix an RF modulated optical signal with a microwave signal. As those skilled in the art will readily recognize, a GaAs MESFET generically comprises an n layer of GaAs (channel) deposited on semi-insulating GaAs (substrate). Source, gate and drain electrodes are then formed on the channel with the gate acting as a Schottky barrier. In this standard MESFET, the difference in doping between the channel and substrate produces a potential barrier. It has been found that when the device is illuminated, the potential barrier is reduced in the region between the source and the gate and drain and the gate. This reduced potential barrier allows more drain current to flow from the device. It has been found that this drain current photoresponse is highly non-linear with respect the gate voltage applied to the device and therefore, it may be used to mix RF modulated optical signals with microwave signals. Accordingly, the present invention uses this effect to mix an optical signal directly or indirectly delivered to the MESFET with an RF signal so as to produce an IF signal.

8 Claims, 3 Drawing Sheets

METHOD FOR MIXING OPTICAL AND MICROWAVE SIGNALS USING A GAAS MESFET

GOVERNMENT INTEREST

The invention described herein may be made, used, sold and or licensed by, or on behalf of, the government of the United States of America without the payment to us of any royalties thereon.

FIELD OF THE INVENTION

The present invention relates to the optical distribution of microwave signals to and from Microwave Monolithic Integrated Circuits (MMIC) and more particularly to mixing light waves and microwaves using a GaAs MESFET in the MMIC Circuitry.

BACKGROUND OF THE INVENTION

Optical control of hybrid and monolithic microwave circuits, such as switches, attenuators, phase shifters and mixers, has been described in several articles. Examples of these articles include: Paolella et al, "Optical Gain Control of a GaAS MMIC Distributed Amplifier," *Microwave and Optical Technology Letters*, Vol. 1, No. 1, March, 1988; Jemison et al, "Optical Control of a Digital Phase Shifter," 1990 *IEEE International Microwave Symposium*, May, 1990, Dallas, Tex.; and Paolella et al, " Optically Controlled GaAs MMIC Switch Using a GaAs MESFET as an Optical Detector," 1990 *MTT-S Symposium Digest*, May 1990.

For many of the applications described in these articles, such as optically controlling the gain, phase and/or switching of the microcircuit requires detection and amplification of the optical signals and therefore, additional devices are needed to accomplish these tasks. Known prior art devices have used GaAs MESFETs as optical detectors with additional amplification stages to provide control of gain, phase and switching of microwave circuits. Examples of such devices are described in U.S. Pat. No. 4,859,965, entitled, "Optical Gain Control of GaAs MMIC Distributed Amplifier," issued to Paolella et al on Aug. 22, 1989; and U.S. Pat. No. 5,086,281, entitled, "Optical Control Circuit for a MMIC," issued to Paolella on Feb. 4, 1992.

Although gain, phase and switching of microwave circuits and mixing of two optical signals to generate a microwave signal (see Fetterman et al, "Control of Millimeter Wave Devices by Optical Mixing," *Microwave and Optical Technology Letters*, Vol. 1, No. 1, pp. 34-39, March 1988) have been achieved, to date, a method has not been proposed to integrate the mixing of an RF modulated optical signal with a microwave signal in a fully monolithic device. The present invention addresses this need.

SUMMARY OF THE INVENTION

Accordingly, it is object of the present invention to use a GaAs MESFET to simultaneously detect an RF modulated signal and mix this signal with another RF signal applied to the gate of the MESFET.

It is another object of the present invention to provide for such an optical detector and mixer of optical and microwave signals without the need of a separate optical detector.

These and other objects are accomplished by the present invention by utilizing the internal photovoltaic effect of a GaAs MESFET. As those skilled in the art will readily recognize, a GaAs MESFET generically comprises an n layer of GaAs (channel) deposited on semi-insulating GaAs (substrate). Source, gate and drain electrodes are then formed on the channel with the gate acting as a Schottky barrier. In this standard MESFET, the difference in doping between the channel and substrate produces a potential barrier. It has been found that when the device is illuminated, the potential barrier is reduced in the region between the source and the gate and drain and the gate. This reduced potential barrier allows more drain current to flow from the device. It has been found that this drain current photoresponse is highly non-linear with respect the gate voltage applied to the device and therefore, it may be used to mix RF modulated optical signals with microwave signals. Accordingly, the present invention uses this effect to mix an optical signal delivered to the MESFET with an electrical RF signal applied at the gate so as to produce an IF signal at the drain.

BRIEF DESCRIPTION OF THE DRAWINGS

These and other features of the present invention may be more fully understood in light of the Detailed Description of the Invention and the appended drawings wherein.

DETAILED DESCRIPTION OF THE INVENTION

Figure 1:
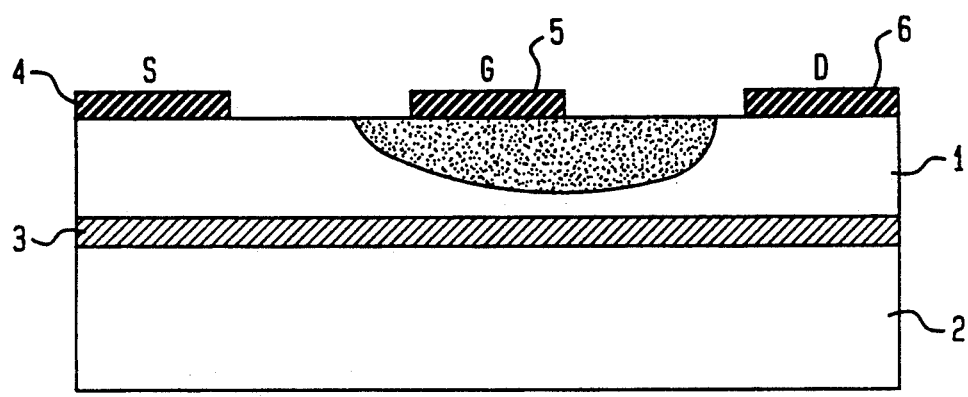
FIG. 1 is a cross-section of a standard MESFET schematic illustrating the potential barrier.

FIG. 1 illustrates a conventional cross-section of a MESFET wherein an n layer of GaAs or channel 1 is deposited on a substrate 2 of semi-insulating GaAs. Source 4, gate 5 and drain 6 contacts are then deposited and/or etched onto the channel 1 in a conventional fashion. The gate material is chosen so that the gate acts as a Schottky barrier on the channel. Due to the difference between the dopants of the channel and substrate a potential barrier 3 is formed.

Figure 2:
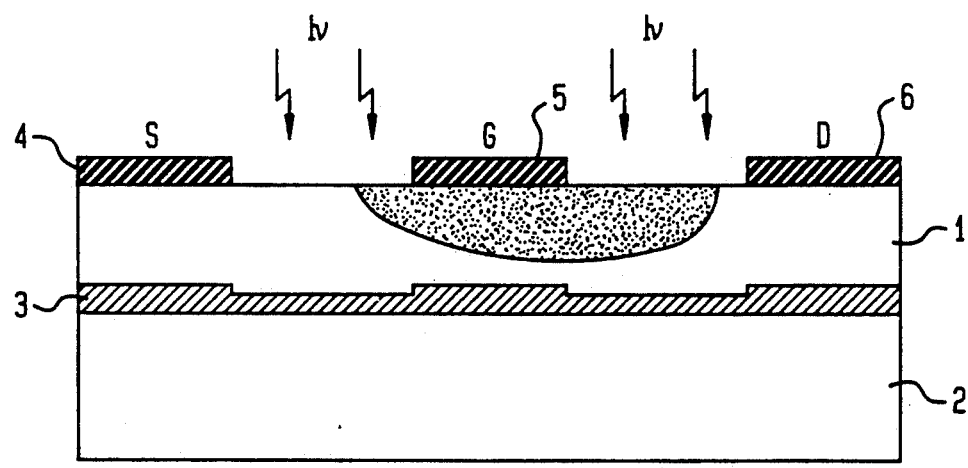
FIG. 2 is a similar cross-section to that shown in FIG. 1, but schematically illustrating the effect of light on the potential barrier in the MESFET.

FIG. 2 illustrates the effect of illumination on the potential barrier of the MESFET. As shown, when the GaAs MESFET is illuminated, the potential barrier between the source and the gate and the drain and gate is reduced. This reduction in the barrier "height" allows an increase in the drain current. This photoresponse of the drain current due to the internal photovoltaic effect may be expressed as:

$$I_{ds} = g_m V_{ph}$$

wherein $g_m$ is the transconductance of the device and $V_{ph}$ is the optically induced photovoltage. The optically induced photovoltage can be approximately expressed as:

$$V_{ph} \approx c_1(Lo)^p + c_1(Lo)^{(p-1)}(L-Lo) + \ldots$$

where $L = Lo[1 + m \cos(\omega_1 t)]$ is the modulated optical intensity, Lo is the average optical intensity, and $\omega_1$ and m are the modulation frequency and depth, respectively. The coefficients $c_1$ and p depend on the specific MESFET.

Further, the voltage at the gate, $V_g$, due to the microwave signal, $V_s$, with frequency $\omega_2$, can be expressed as:

$$V_g = V_s \cos(\omega_2 t)$$

and the drain current, at a given bias level, can be expressed as:

$$I_d = I_{db} + a_1 V_{gl} + a_2 (V_{gl})^2 + a_3 (V_{gl})^3 + \ldots$$

where $a_1$, $a_2$, and $a_3$ are coefficients that depend on the bias voltages, and $I_{db}$ is the d.c. quiescent point. Therefore, because the sum of the electrically and optically generated voltages, $V_{gl}$, can be expressed as:

$$V_{gl} = V_g + V_{ph},$$

substituting the last two equations for each other will yield the component of the drain current at the intermediate frequency (IF) $\omega_2 - \omega_1$:

$$I_{d(IF)} = c_1 a_2 p m (Lo)^p V_s.$$

This simplified derivation shows that the IF drain current is dependent upon the pertinent parameters of the microwave input $V_s$, optical input Lo, m, and the device characteristics, $a_2$, $c_1$ and p.

Accordingly, the present invention utilizes this principle to mix two RF sources, one modulating an optical signal and the other from a conventional source.

Figure 3:
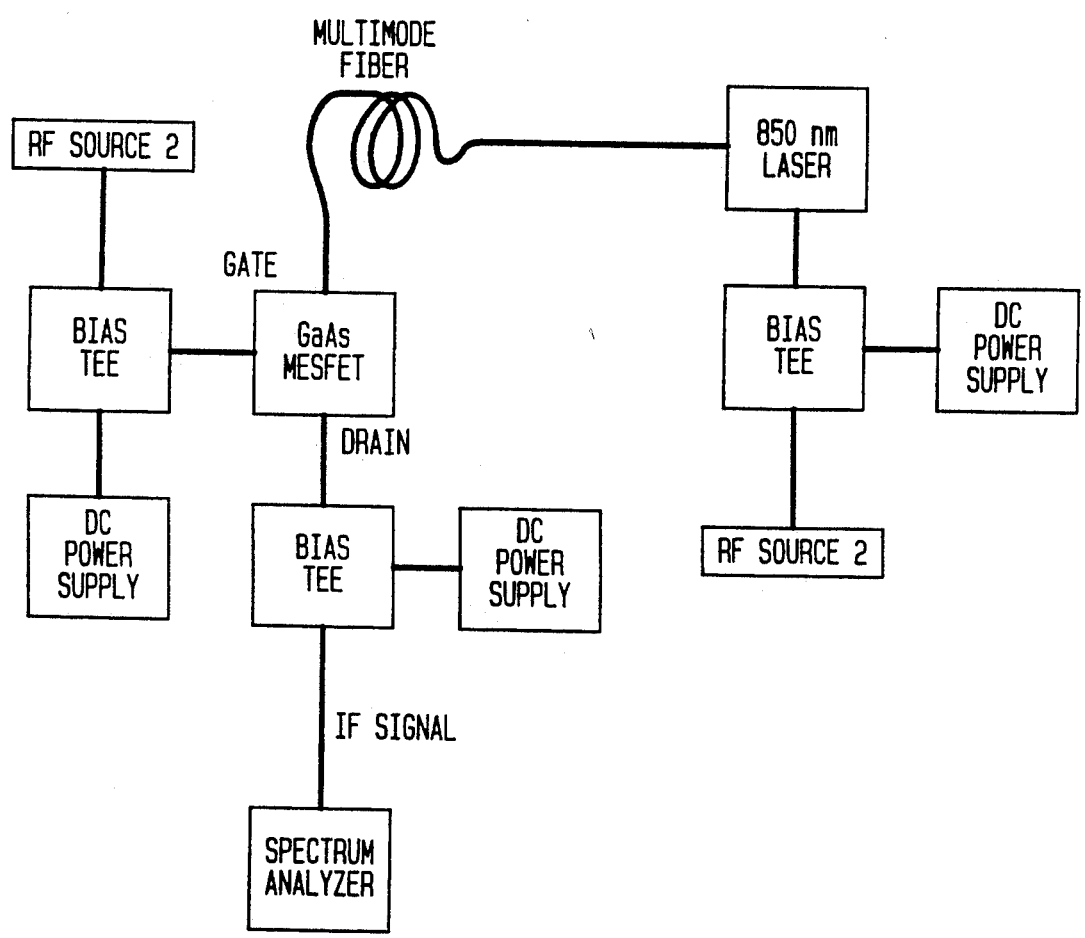
FIG. 3 is a block diagram of an experimental set-up for the present invention.

FIG. 3 illustrates the preferred embodiment for a mixer utilizing direct optic modulation. As shown, the signal from an laser, such as an Ortel SL 1020 laser at a wavelength of 850 nanometers, is directly modulated by a first RF source which is coupled to the laser via a bias tee and powered by a DC power supply. The RF modulated optic signal is delivered to the GaAs MESFET by a multimode optical fiber terminated by a hemispherical lens for enhanced optical coupling. A three axis computer controlled micropositioner may be used to position the fiber over the electrical contacts of the MESFET for maximum photoresponse. The gate of the MESFET is coupled to a second conventional RF source via a second bias tee powered by a second DC power supply and the drain of the MESFET is similarly output to a spectrum analyzer via a third bias tee powered by a third DC power supply.

An example of a commercial MESFET which can be used for the purposes of the present invention is an ITT GTC213-1 which has four 75 micrometer wide gate fingers, a gate length of 0.8 micrometers and a dopant concentration of $3 \times 10^{17}$ cm$^{-3}$. However, as those skilled in the art will now recognize that for this application, the high frequency response of the MESFET can be greatly improved by altering the gate electrode configuration to permit better optical coupling. The commerical MESFET given as an example above has a ratio of absorbed to incident photons of less than 10% since the metal electrodes block most of the light entering the GaAs. Therefore, by altering the geometry of the device, such as by increasing the number of gate fingers while decreasing their length, by providing an elliptical spot size with a cylindrical lens, and/or by adding an antireflective coating on top of the MESFET, the optical coupling efficiency of the MESFET can be increased to 40% or even higher. This corresponds to a 12 dB increase in the photoresponse (and in the IF output) of the MESFET in the entire spectral range. Further optimization in the frequency response of the MESFET can be achieved by modifying the doping profile and by increasing the doping ratio between the epi layer and the substrate of the MESFET to reduce the barrier capacitance. This would reduce the RC time constant associated with the internal photovoltaic effect or optical gate and extend the corner frequency by a decade. Of course, because those skilled in the art will be able to devise any number of ways to increase the frequency response using similar techniques, the inventors herein do not wish to limit their invention by the above given ways of increasing the frequency response of the MESFET.

In an experiment to confirm the mixing of the RF sources utilizing the direct mixing configuration, the device was operated with a reverse bias of 0.5 volts at the gate and a drain to source voltage of 2 volts. The amplitudes of the RF sources were set to +5 dBm. Because the IF output of the drain current is dependant upon the optical modulation depth m, the modulation depth of the laser was set to 100%. Using the Ortel laser model mentioned above, the average optical output power equaled 1.8 mW. In addition to the optical input, a signal from the second RF source was applied to the gate of the device and the IF output was measured at the drain using a spectrum analyzer with a resolution bandwidth of 100 kHz.

Figure 4:
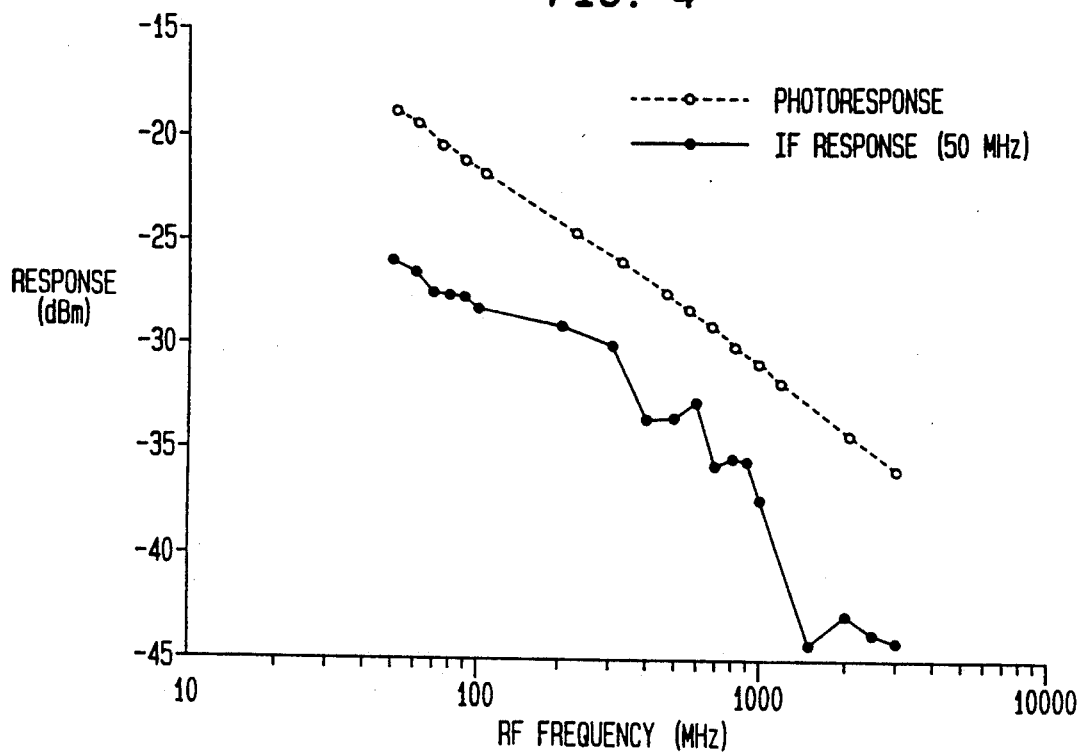
FIG. 4 graphically illustrates the IF response of the present invention as a function of RF frequency.

The IF response of the two mixer configurations, as well as the photoresponse of the MESFET, are plotted as a function of the modulation frequency in FIG. 4. (As noted on the graph the frequency difference between the sources was held constant at 50 MHz.) As shown, the down converted IF output of the MESFET emulates the photoresponse spectrum of the device with a conversion loss in the range of 5 to 10 dB. This loss is attributable to the lack of optical coupling efficiency noted above because in the experimental configuration a commercial MESFET was used. Moreover, it should be noted that no impedance matching means were used in the experimental configuration thus accounting for the peaks and valleys in the spectra. Therefore, impedance matching means, which have not been shown, are obviously needed for the present invention.

Figure 5:
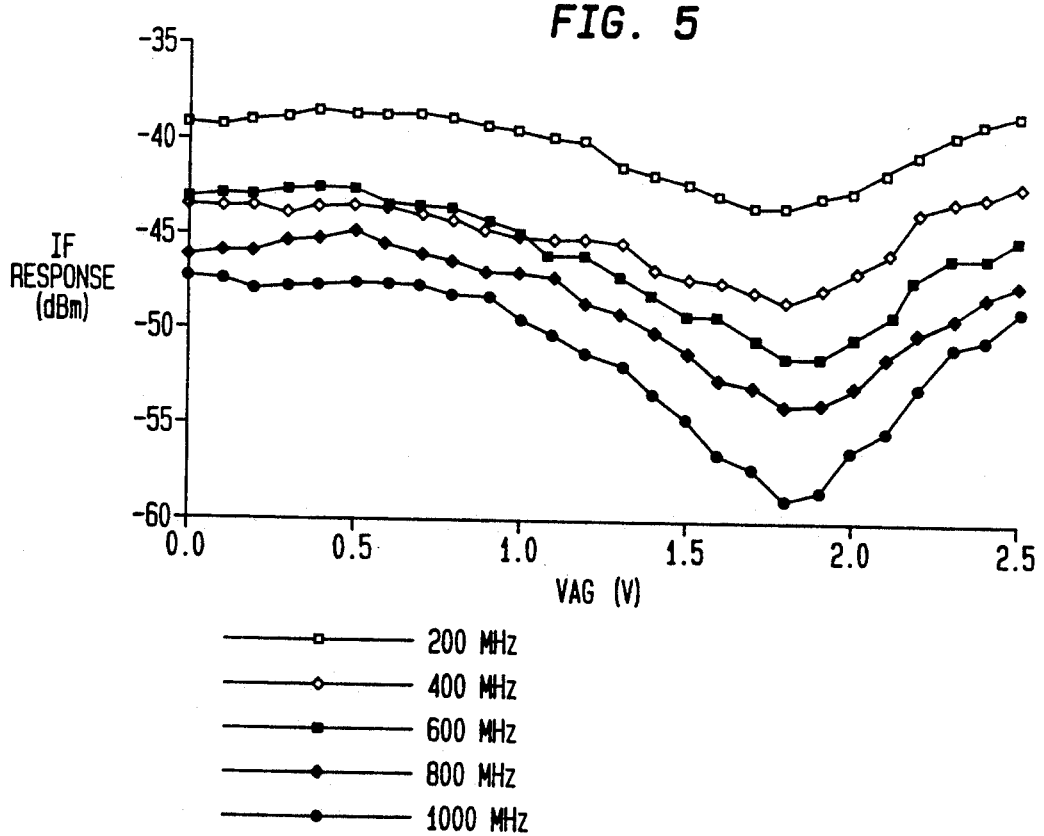
FIG. 5 graphically illustrates a plot of the IF response vs. the source-gate voltage.

The plot of the IF response vs. source-gate voltage is shown in FIG. 5. As shown, the IF response of the MESFET is strongly dependent on the gate bias voltage and is maximized when the gate is reversed biased at around 0.5 V. It should be noted, however, the noise figure of the MESFET is also dependant on the gate-source voltage and therefore, the optimum noise figure may not coincide with the optimum mixing product.

Although the present invention has been described in relation to a particular embodiment thereof, many other variations and modifications and other uses will become apparent to those skilled in the art. It is preferred, therefore, that the present invention be limited not by the specific disclosure herein, but only by the appended claims.

What is claimed is:

1. A monolithic microwave integrated circuitry optical-electrical signal mixer comprising:
   a metal-semiconductor field effect transistor (MESFET) having source, gate and drain electrodes;
   a first RF source;

an optical signal source electrically coupled to the first RF source and optically coupled to the MESFET such that an RF modulated optical signal may be delivered to the MESFET;

a second RF source electrically coupled to the gate of the MESFET; and means to bias the MESFET across the source and gate electrodes;

wherein the RF modulated optical signal is mixed with the second RF source due to modulations of a potential barrier of the MESFET and an IF signal is output through the drain electrode of the MESFET.

2. The monolithic microwave circuitry of claim 1 wherein the optical signal source is optically coupled to the MESFET via an optic fiber.

3. The monolithic microwave circuitry of claim 2 wherein the optic fiber is coupled to a cylindrical lens so as to produce an elliptical spot size.

4. The monolithic microwave circuitry of claim 1 wherein the optical signal source is a laser diode directly mounted on the MESFET.

5. The monolithic microwave circuitry of claim 1 wherein the MESFET is a Gallium Arsenide MESFET.

6. The monolithic microwave circuitry of claim 5 wherein the gate electrode of the MESFET is a plurality of short gate fingers.

7. The monolithic microwave circuitry of claim 5 wherein the MESFET is coated with an antireflective coating.

8. The monolithic microwave circuitry of claim 5 wherein the MESFET comprises an epi layer, a substrate and barrier between the epi layer and substrate and wherein a doping ratio exists between the epi layer and substrate, the doping ratio being increased so as to reduce a capacitance of the barrier.

* * * * *